United States Patent [19]

Sawford-Atkins

[11] 4,080,031
[45] Mar. 21, 1978

[54] GUIDE FOR PRINTED CIRCUIT BOARDS

[75] Inventor: Derek Sawford-Atkins, Staines, England

[73] Assignee: Honeywell Inc., Minneapolis, Minn.

[21] Appl. No.: 750,577

[22] Filed: Dec. 14, 1976

[30] Foreign Application Priority Data

Apr. 15, 1976 United Kingdom .............. 15568/76

[51] Int. Cl.² ...................... H05K 1/07; H01R 13/62
[52] U.S. Cl. .................................................. 339/65
[58] Field of Search ................ 339/17 L, 17 LM, 44, 339/45, 65, 66, 75 P, 176 MP; 361/399, 415; 211/41; 40/125 H, 152.1, 155

[56] References Cited

U.S. PATENT DOCUMENTS 3,216,580  11/1965  Fricker, Jr. ............................ 211/41
3,784,954  1/1974   Grimm et al. ....................... 361/399

FOREIGN PATENT DOCUMENTS 371,210  4/1932  United Kingdom .............. 40/125 H 1,093,391  12/1967  United Kingdom .............. 339/45 M

OTHER PUBLICATIONS

IBM Technical Disclosure Bulletin, M. E. Ecker et al, vol. 10, No. 11, Apr. 1968, p. 1652.

Primary Examiner—Neil Abrams
Attorney, Agent, or Firm—Laurence J. Marhoefer; Lockwood D. Burton; Mitchell J. Halista

[57] ABSTRACT

A guide for a printed circuit board has a base portion which is mounted adjacent to a printed circuit board edge connector and a guide portion hinged on the fixed portion and having a longitudinal groove for guiding a longitudinal edge of a printed circuit board to introduce a printed wiring connection edge of the board into an edge connector located adjacent to the base portion while the hinged interconnection allows the guide portion to be selectively rotated during the absence of a printed circuit board in the guide portion to cover the edge connector.

10 Claims, 4 Drawing Figures

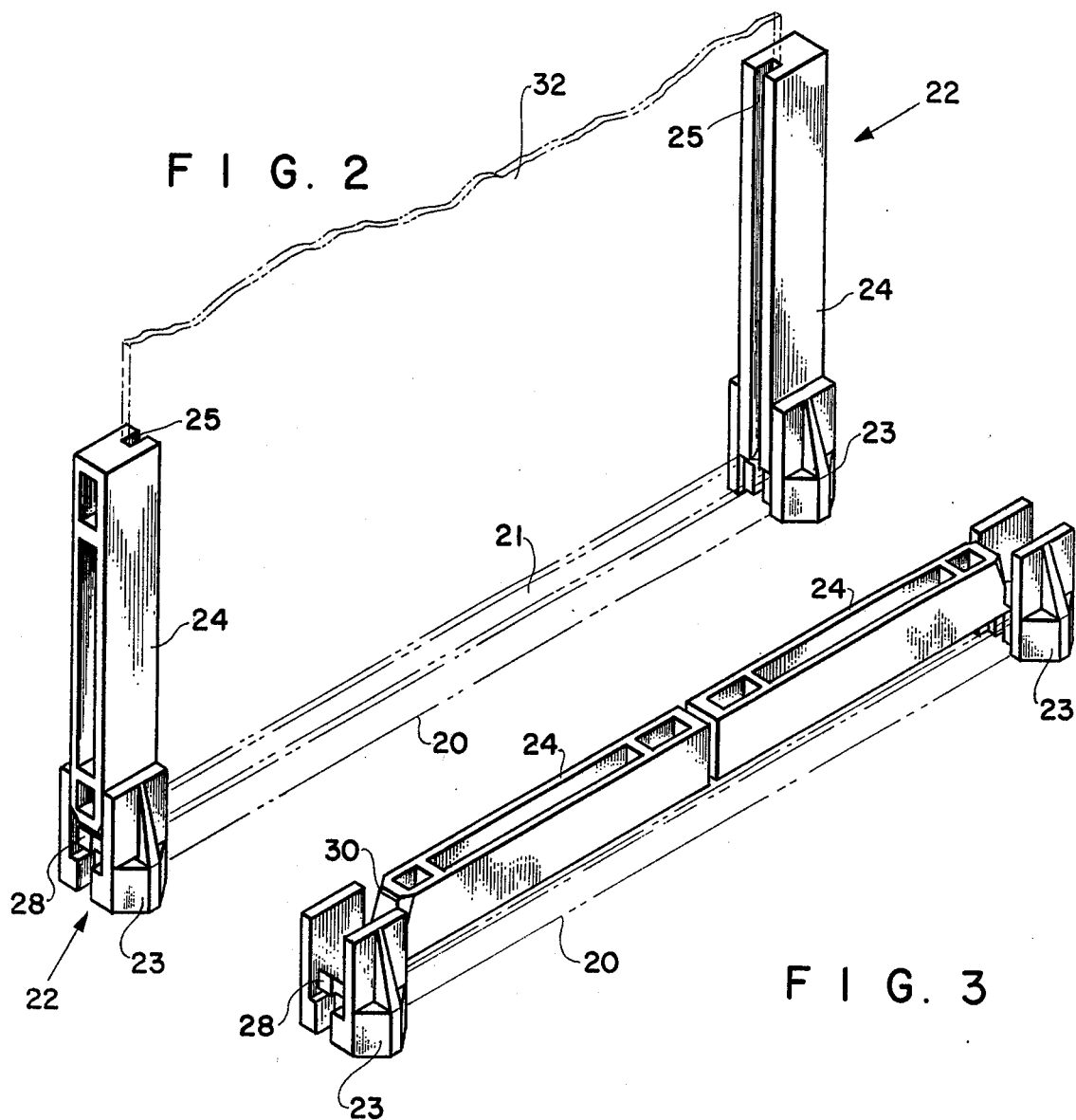
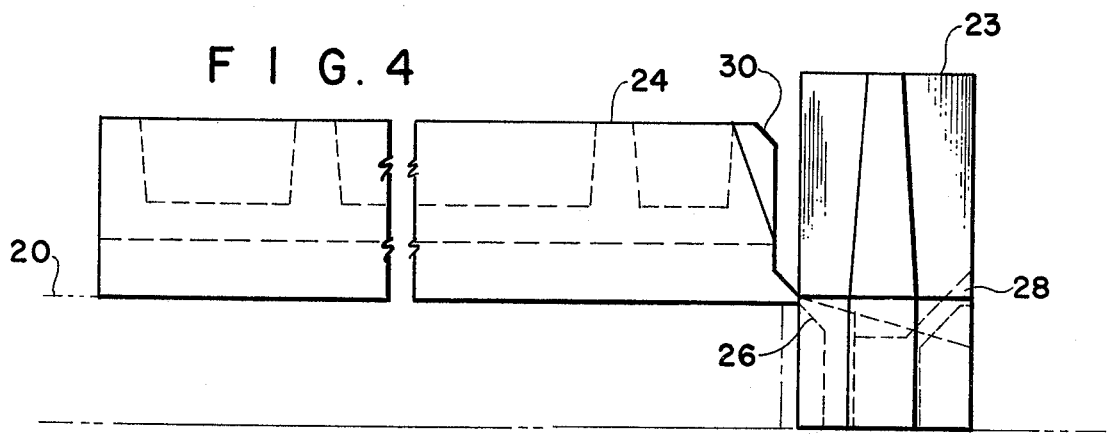

GUIDE FOR PRINTED CIRCUIT BOARDS

BACKGROUND OF THE INVENTION

1. Field Of The Invention

The present invention relates to guides for printed circuit boards. More specifically, the present invention is directed to guides for guiding printed circuit boards into edge connectors and for protecting the edge connector during the absence of a printed circuit board.

2. Description Of The Prior Art

It is known in the prior art to provide a printed circuit board guide for guiding a printed circuit board to introduce an electrical connection edge of the board into an electrical edge connector. Such guides usually comprise a pair of grooved members arranged perpendicularly to the edge connector and positioned at respective ends of the edge connector with the grooved sides facing the edge connector. A typical prior art printed circuit board guide is shown in U.S. Pat. No. 3,216,580 of F. V. Fricker, Jr. and assigned to the same assignee as the present application. In such prior art guides, to insert a printed circuit board connection edge into the edge connector, the longitudinal edges of the printed circuit board are inserted into respective grooves of the two associated guides. Subsequent motion of the printed circuit board along the guides is effective to guide the board connection edge into the edge connector. While such prior art guides afford a means for guiding a printed circuit board connection edge into the edge connector, they do not afford a means for protecting the edge connector when the printed circuit board is not present in the edge connector. Thus, the edge connector is open to the accumulation of debris and/or the damage of the electrical connectors in the edge connector by the entry of undesired objects. Further, the height of the fixed guides in the prior art fixes the vertical space required by the associated equipment which prevents the equipment from assuming a minimal storage size during the absence of the printed circuit boards. Accordingly, it is desirable to provide a printed circuit board guide for guiding a printed circuit board into an edge connector while also affording a means for protecting the edge connector and reducing the height of the board guide during the absence of a printed circuit board therein.

SUMMARY OF THE INVENTION

An object of the present invention is to provide an improved circuit board guide for guiding a printed circuit board electrical connection into an edge connector while affording a means for protecting the edge connector during the absence of a printed circuit board therein.

In accomplishing this and other objects, there has been provided, in accordance with the present invention, a printed circuit board guide having a base portion mounted adjacent to an edge connector and a guide portion having a groove for guiding the printed circuit board with respect to the edge connector and a hinge means rotatably connecting the guide portion to the base portion to enable the guide portion to be rotated on the base portion to cover the edge connector during the absence of a printed circuit board in the guide portion.

BRIEF DESCRIPTION OF THE DRAWINGS

A better understanding of the present invention may be had when the following detailed description is read in connection with the accompanying drawings, in which:

FIG. 2 is a pictorial illustration of another embodiment of a printed circuit board guide also embodying the present invention, FIG. 3 is a pictorial illustration of the guide shown in FIG. 2 in an edge connector protecting position and FIG. 4 is a detailed showing of the edge connector of FIG. 2 to reveal the internal structure thereof.

DESCRIPTION OF THE PREFERRED EMBODIMENT

Figure 1:
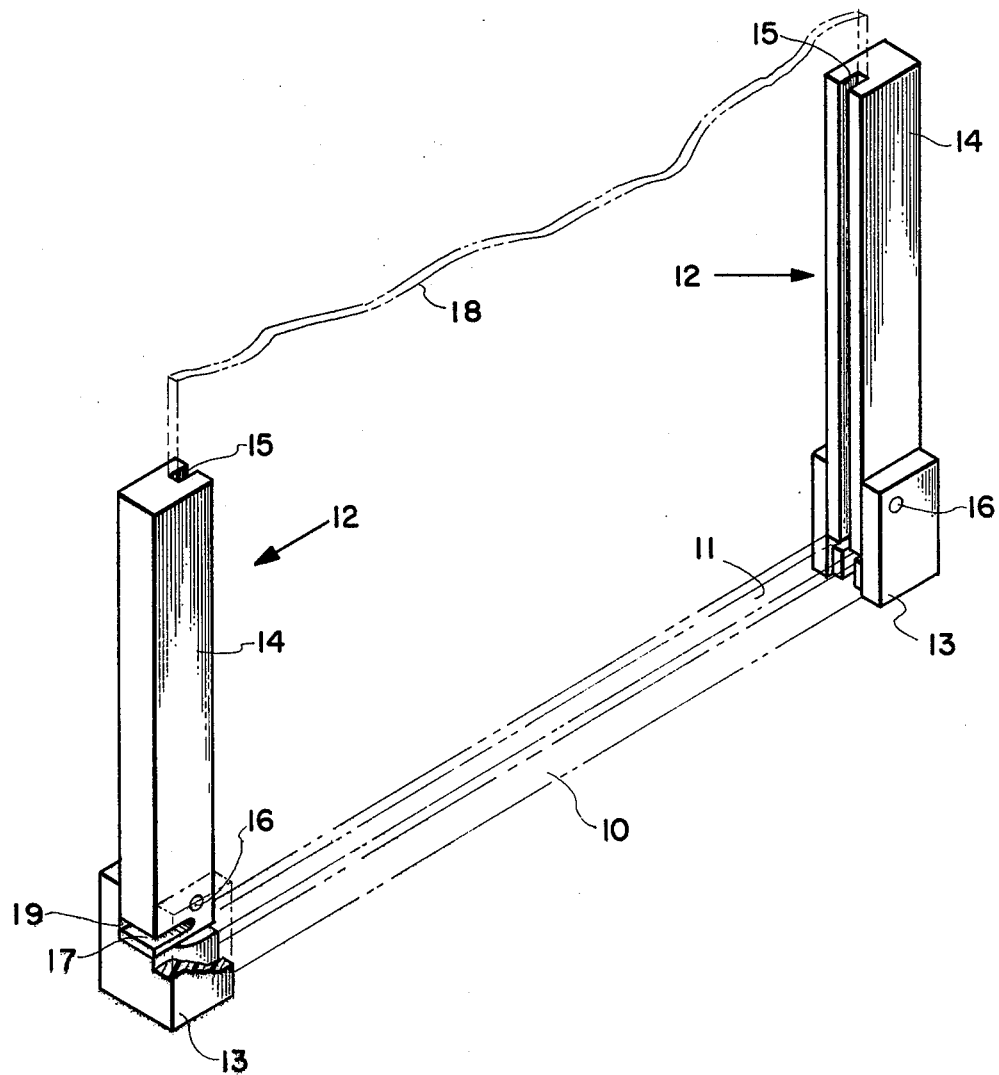
FIG. 1 is a pictorial illustration of a printed circuit board guide embodying the present invention.

Referring to FIG. 1 in more detail, there is shown a printed circuit board guide embodying the present invention for use with a conventional edge connector 10. The edge connector 10 has internal electrical connections (not shown) arranged in a groove 11 arranged along one side of the edge connector 10 for providing electrical connections to a printed circuit board inserted into the edge connector 10. A printed circuit board guide 12 is positioned adjacent to both ends of the edge connector 10 to guide a printed circuit board into the edge connector 10. Each printed circuit board guide 12 includes a slotted fixed base member 13, a hinged guide member, or portion, 14 and a hinge rod, or pin, 16. The base member 13 and the guide portion 14 may be advantageously of an electrically insulating material, e.g., plastic, while the hinge pin may be a metal rod. An end of the guide member 14 is located within the slot in the base member 13 and held captive therein by the hinge pin 16. The hinged portion is approximately half as long as the edge connector 10 so that when the hinged portions 14 of the two guides 12 are folded down over the edge connector 10 the free ends of the hinged guide portions 14 are adjacent to one another to protect the internal structure of the edge connector from debris and physical damage. Each hinged guide portion 14 has a groove 15 along its length to enable a printed circuit board 18 to be inserted therein for guiding an electrical connection edge of the board 18 into the edge connector 10. Each of the hinged portions 14 also has a slot 17 near its lower end extending from a surface of the hinged portion 14 opposite to that having the groove 15 therein to a depth sufficient to provide a flexible connection between the two portions of the hinged guide 14 separated by the groove 17. The slotted end of each of the guide members 14 contacts an internal surface of the respective base member 13 located at the bottom of the slot 19 in the base member 13. The bottom of the slot 19 may be relieved under the hinge pin 16 to provide clearance for the adjacent corner of the guide member 14.

MODE OF OPERATION

In order to guide a printed circuit board into the edge connector 10 the hinged portions 14 of both of the edge guides 12 are swung on their respective hinge pins 16 into a vertical position with respect to the edge connector 10. The printed circuit board 18 is then inserted into the groove 15 on both of the guides 12 and pushed along the hinged guide portions 14 until the electrical connectors in the edge connector 10 mate with the connection edge of the printed circuit board 18. When the hinged portion 14 is swung into its vertical position, the lower edge of the hinged portion 14 contacts the bottom surface of the slot 19 in the base portion 13 which surface is arranged to provide a slight inward slope of the hinged portion 14. The subsequent insertion of a printed circuit board 18 into the groove 15 is effective to guide a connection edge of the printed circuit board having printed electrical connection areas thereon into the edge connector 10. The hinged guide portions 14 are biased toward the printed circuit card 18 by the resiliency of the end of the guide portion 14 having the slot 17 therein and the angle of contact of the slotted end of the guide portion 4 with the fixed base portion 13. Thus, the contacting internal surfaces of the fixed base member 13 and the slotted end of the guide portion 14 are arranged to bias, i.e., incline the guide portion 14 toward the printed circuit card 18. Concurrently, the slotted end of the guide portion 14 allows the guide portion 14 to be repositioned to accept the board 18. In the absence of the printed circuit card 18, the guide portions 14 can be rotated on the hinge pin 16 to a position over the edge connector 10 to protect the internal structure of the edge connector 10 and to reduce the height of the apparatus on which the guides 12 are mounted.

In FIGS. 2, 3 and 4 there are shown pictorial views of an alternate embodiment of the novel guide structure of the present invention. Referring to these figures, an edge connector 20 having a slot 21 for electrical connections (not shown) is positioned between a pair of printed circuit board guides 22. Each of the guides 22 has a fixed base member 23 and a movable guide portion 24. In this alternate structure, the hinge pin 16 as shown in FIG. 1 is replaced by an integral hinge 26 connecting a guide portion 24 to a fixed base member 23. Further, instead of a slotted end on the guide portion 24 as used on the guide portion 14 shown in FIG. 1 the fixed base member 23 is arranged to have an integral resilient finger 28 engaging a tapered surface 30 on the guide portion 24. The engagement of the tapered surface 30 and the resilient finger 28 is arranged to bias the guide portion 24 toward a printed circuit board 32 being guided by the guides 22 of the embodiment shown in FIGS. 2, 3 and 4. Further, the resilient finger 28 allows the guide portions 24 to be repositioned to accommodate the board 32. The guide 24, the base 23, the hinge 26 and the finger 28 may be advantageously molded of a single piece of plastic.

Accordingly, it may be seen that there has been provided, in accordance with the present invention, a printed circuit board guide for guiding a printed circuit board while affording a means for protecting an edge connector used to provide electrical connections to the printed circuit board.

The embodiments of the invention in which an exclusive property or privilege is claimed are defined as follows:

1. A printed circuit board guide comprising
   a fixed guide support means,
   a board guide means, and
   hinge means connecting said guide means to said fixed means while allowing a rotation of said guide means with respect to said fixed support means between a first position and a second position displaced approximately 90° from said first position and including an electrical edge connector located adjacent to said board guide means, said board guide means in said first position being located to guide a circuit board into contact with said edge connector and in said second position overlying and covering a circuit board receiving face of said edge connector to prevent damage thereto.

2. A printed circuit board guide as set forth in claim 1 wherein said guide means includes a longitudinal groove for accepting an edge of a printed circuit board therein.

3. A printed circuit board guide as set forth in claim 1 wherein said hinge means includes a hinge pin extending between said fixed means and said guide means.

4. A printed circuit board guide as set forth in claim 1 wherein said guide means includes bias means for engaging said fixed means to bias said guide means toward a printed circuit board guided by said guide means.

5. A printed circuit board guide comprising
   a first guide having a first fixed support means, a first board guide means and a first hinge means connecting said first fixed support means to said first guide means while allowing said first guide means to rotate with respect to said first fixed support means between a first position and a second position displaced approximately 90° from said first position,
   a second guide including a second board guide means, a second fixed support means and a second hinge means connecting said second guide means to said second fixed support means while allowing a rotation of said second guide means with respect to said second fixed means between a first position and a second position displaced approximately 90° from said first position, said second guide means of said second guide being spaced from said first guide means of said first guide to accommodate a printed circuit board therebetween, and
   an electrical edge connector located between said first fixed support means and said second fixed support means, said first and second board guide means in said first position being located to guide a circuit board into contact with said edge connector and in said second position each overlying and covering a respective portion a board receiving face of said edge connector to prevent damage thereto.

6. A guide means as set forth in claim 5 wherein said guide means of said first guide includes a longitudinal groove for accommodating a printed circuit board therein and said guide means of said second guide includes a longitudinal groove for accommodating an edge of a printed circuit board therein.

7. A printed circuit board guide assembly as set forth in claim 6 wherein said fixed means of said first and second guides each includes means for biasing some guide means of said first and second guides toward the printed circuit board located therebetween.

8. A printed circuit board guide assembly as set forth in claim 5 wherein said hinge means of each of said first and second guides includes a hinge pin extending between said fixed means and said guide means.

9. A printed circuit board guide assembly as set forth in claim 5 wherein said guide means of said first and second guides each have a length which is approximately one-half the distance between said guide means of said first and second guides.

10. A printed circuit board guide assembly as set forth in claim 5 wherein said guide means and said fixed support means of said first and second guides are each made of an electrically non-conductive material.

* * * * *